(12) United States Patent
Simonsen

(10) Patent No.: US 6,975,843 B2
(45) Date of Patent: Dec. 13, 2005

(54) METHOD AND AN ARRANGEMENT RELATING TO TELECOMMUNICATIONS SYSTEMS

(75) Inventor: Tom Simonsen, Struer (DK)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 644 days.

(21) Appl. No.: 10/026,936

(22) Filed: Dec. 27, 2001

(65) Prior Publication Data

US 2003/0003877 A1    Jan. 2, 2003

Related U.S. Application Data

(60) Provisional application No. 60/301,816, filed on Jul. 2, 2001.

(30) Foreign Application Priority Data

Dec. 21, 2000  (SE) .................. 0004821

(51) Int. Cl.[7] .................. H04B 1/04; H04B 1/02
(52) U.S. Cl. .............. 455/126; 455/127.1; 455/127.2; 455/107; 375/295; 375/296; 375/297
(58) Field of Search .................. 455/115.1, 116, 455/126, 127.1, 127.2, 107; 375/295, 296, 375/297

(56) References Cited

U.S. PATENT DOCUMENTS

| | | | | |
|---|---|---|---|---|
| 4,147,985 A | * | 4/1979 | Rogers ........................ | 455/126 |
| 4,178,556 A | | 12/1979 | Attwood | |
| 4,247,948 A | * | 1/1981 | Okada et al. ................ | 455/116 |
| 4,524,335 A | | 6/1985 | Yokoyama | |
| 4,635,296 A | * | 1/1987 | Dinsmore .................... | 455/113 |
| 4,864,589 A | * | 9/1989 | Endo ........................... | 375/141 |
| 5,472,443 A | * | 12/1995 | Cordis et al. ................ | 606/48 |
| 5,703,565 A | * | 12/1997 | Herring ...................... | 340/572.7 |
| 5,703,576 A | * | 12/1997 | Spillman et al. ........ | 340/870.31 |
| 5,834,987 A | * | 11/1998 | Dent ........................... | 332/127 |

(Continued)

FOREIGN PATENT DOCUMENTS

WO    WO 98/19391    5/1998

(Continued)

OTHER PUBLICATIONS

Piessens, T., et al. SOPA: A high-efficiency line driver in 0.35 / spl mu/m CMOS using a self-oscillating power amp In: 2001 IEEE International Solid-State Circuits Conference. Digest of Technical Papers. ISSCC. San Francisco, CA, U Feb. 7, 2001, pp. 306-307, 45, ISBN: 0-7803-6608-5.

*Primary Examiner*—Sonny Trinh
*Assistant Examiner*—Un C Cho
(74) *Attorney, Agent, or Firm*—Nixon & Vanderhye P.C.

(57) ABSTRACT

A transmitter with a pulse width modulation amplifier includes an inner positive feedback loop, which has a self oscillating modulator and a switching stage and is connected to an LP filter. Outer feedback loops from the LP filter respective from an output transformer are coupled to a compensation block connected to the inner loop. An input telecommunications signal, fed via the compensation block, is superimposed on a carrier from the modulator into a pulse width modulated signal, which is amplified, filtered and fed to the transformer. The input signal is compared with feedback signals. Phase shift caused by the LP filter is partly compensated by the inner loop. A switching frequency in the modulator therefore can be comparatively low. An output impedance is kept on a predetermined level, enabling connection of a receiver. Advantages are low power dissipation, high packing density, high frequency bands and use in bidirectional communication.

11 Claims, 6 Drawing Sheets

U.S. PATENT DOCUMENTS

| | | |
|---|---|---|
| 5,909,153 A | 6/1999 | Delano et al. |
| 6,075,817 A * | 6/2000 | Gruenberg ............... 375/240 |
| 6,246,283 B1 | 6/2001 | Ahuja et al. |
| 6,281,747 B2 | 8/2001 | Ahuja et al. |
| 6,295,443 B1 * | 9/2001 | Matthew et al. ......... 455/115.1 |
| 6,362,702 B1 * | 3/2002 | Nielsen et al. ............. 332/149 |
| 6,388,431 B1 * | 5/2002 | Kramer et al. ............. 323/266 |
| 2001/0030612 A1 * | 10/2001 | Kerber et al. .......... 340/825.69 |

FOREIGN PATENT DOCUMENTS

| WO | WO 02/25357 | 3/2002 |
|---|---|---|

* cited by examiner

METHOD AND AN ARRANGEMENT RELATING TO TELECOMMUNICATIONS SYSTEMS

This application claims the benefit of Provisional Application No. 60/301,816, filed Jul. 2, 2001, the entire content of which is hereby incorporated by reference in this application.

TECHNICAL FIELD OF THE INVENTION

The present invention relates generally to a method and an apparatus for transmitting telecommunications signals.

BACKGROUND

The demand for high speed telecommunications transmission has grown rapidly in later years. In order to provide such high speed telecommunications transmission, wide bandwidths including high frequencies are being used. Ordinary copper wires, originally intended for analogue telephony, are upgraded to Digital Subscriber Lines DSL, using various transmission techniques. The analogue bandwidth of about 4 kHz, is often increased to several MHz. However, the handling of high bandwidths puts several requirements on the transmission equipment in terms of frequency response, linearity, distortion, noise etc and especially power consumption.

Various transmission and encoding techniques are used for the abovementioned upgrading, e.g. Discrete Multi Tone DTM, for handling ADSL transmission on ordinary copper wires. Generally, all DSL transmission methods, regardless of type (ADSL, VDSL, HDSL, SHDSL etc.), involve a transmission design based on certain digital parts, e.g. DSPs, CODECs and analogue front-end parts with linear broadband amplifiers for both the transmit and receive direction.

The abovementioned amplifiers are typically based on traditional broadband amplifiers using Class A, Class A/B, Class B or even Class G amplifier principles. These amplifier classes are all characterised by having a "built-in" power dissipation because of the design principle itself. The amplifiers have ordinary push-pull transistor coupling with a constant bias current in order to reduce e.g. cross over distortion.

The DSL transmission requires typically 100 mW of power transmitted to the line. In order to handle this transmission power, the ordinary amplifiers dissipate up to approximately 800 mW or even 900 mW. The Class G amplifier, using two supply voltages, may reduce the dissipation to approximately 600 mW or even less. Still there is currently a substantial power dissipation around five or six times higher than the required power transferred to the line.

This very high power dissipation and consumption leads to an expensive and bulky implementation, which becomes increasingly more challenging to handle in Central Office development. The amount of broadband subscribers are also expected to increase rapidly in the coming years.

In the international patent application with publication number WO 98/19391 is described the use of a Class D amplifier for the audio frequency range. The Class D amplifier is a Pulse Modulation Amplifier PMA and has among others the advantages that the power dissipation is very low, low complexity and good fidelity. The PMA disclosed in the WO-application includes a pulse modulator including a power amplifier stage. The power amplifier output has one or more negative feedback loops to preamplifiers preceding the modulator. In one disclosed embodiment the pulse modulator is a self oscillating modulator. The PMA is connected to a loudspeaker and has a low output impedance.

SUMMARY

The present invention deals with the problem of reducing power dissipation in a telecommunications transmitter.

A further problem is to transmit signals of a predetermined frequency band.

Still a problem is to make it possible to utilize the transmitter in bidirectional communication, i.e. to make it possible to connect a receiver at the transmitter output to a telecommunications line.

Another problem is to utilize the transmitter on limited space or with high packing density.

A purpose with the present invention is to reduce power dissipation in a telecommunications transmitter.

A further purpose is to transmit signals of a predetermined frequency band.

Still a purpose is to make it possible to utilize the transmitter in bidirectional communication.

Another purpose is to utilize the transmitter on limited space or with high packing density.

The solution of the problem resides in the insight that a transmitter, having a pulse width modulation amplifier and a controlled self oscillating modulator, can be used for transmitting telecommunication signals in a predetermined frequency band.

The solution includes loop coupling a switching stage with a self oscillating modulator, the latter generating a carrier signal. An incoming signal modulates the carrier and is fed to the switching stage, where it is amplified. The amplified signal is filtered and fed to a load and also loop coupled to the transmitter input. The output impedance is adjusted to a finite value so that it can serve as a termination for a far end transmitter.

An advantage with the invention is that the transmitter has low power dissipation. It can therefore in a convenient way be utilized in e.g. a central office with several transmitters and high packing density. It can also be used when the space is limited, e.g. in a customer modem.

A further advantage is that the transmitter can be utilized for a predetermined frequency band.

Still an advantage is that the transmitter can be utilized for bidirectional communication.

The invention will now be described more in detail with the aid of preferred embodiments in connection with enclosed figures.

DETAILED

Figure 1:
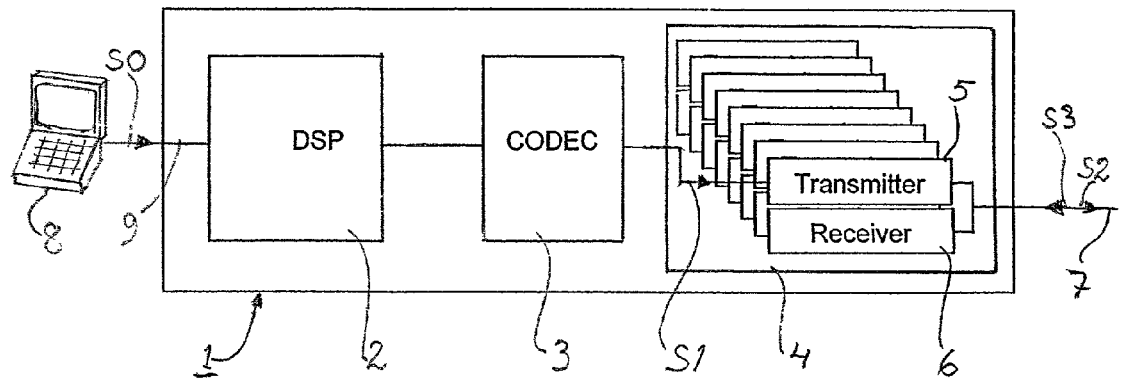
FIG. 1 shows a block schematic over a chip set.

FIG. 1 shows the general transmission design for different DSL transmission methods (ADSL, VDSL, HDSL, SHDSL etc.). A chip set 1 on e.g. a line card includes a digital signal processor 2 (DSP) connected to a coder/decoder 3 (CODEC), which in turn is connected to a block 4 with a set of transmitters 5 and receivers 6. A pair of transmitter/receiver is connected to a line 7 for incoming and outgoing signals. A digital equipment 8 is connected to the DSP 2 via a line 9. A signal S0, incoming to the chip set 1 on the line 9, is signal processed in the DSP 2 and the CODEC 3 into a signal S1, which is inputted to the transmitter 5. The signal S1 is further processed in the transmitter, including an amplification, and is transmitted as a signal S2 on the line 7. An incoming signal S3 on the line 7 is received by the receiver 6. As is shown in FIG. 1 the chip set 1 includes several transmitters/receivers and e.g. a central office can include a great number of chip sets on its line cards. The packing density of components can be rather high and it is essential that the power dissipation from each transmitter/receiver is restricted. To bring about this power dissipation restriction, an amplifier of the earlier mentioned Class D can be utilized. The transmitter described in the present document is such a Class D amplifier, which is advantageously utilized in the chip set 1.

Figure 2:
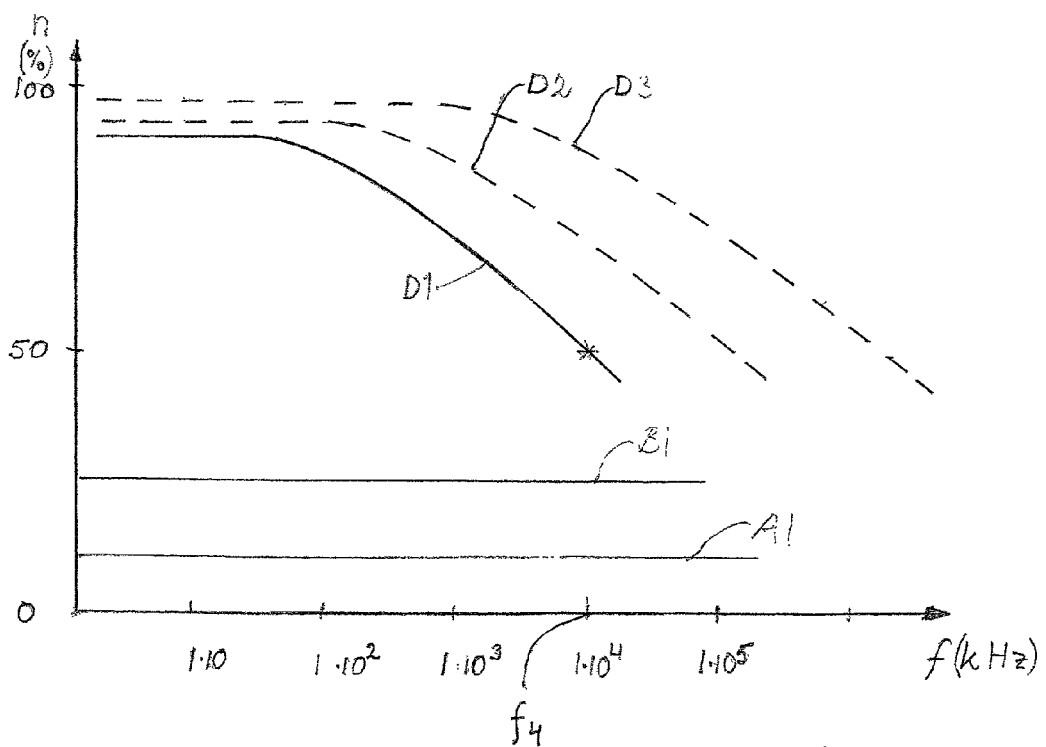
FIG. 2 shows a diagram with efficiency curves for different classes of amplifiers.

FIG. 2 shows a diagram with a simplified overview over the efficiency for different classes of amplifiers. The diagram shows how the efficiency n in % varies with the frequency f in kHz. A line A1 shows that a Class A amplifier has an efficiency of about 10% in all the frequency range and a line B1 shows that a Class B amplifier lies around 25%. A curve D1 indicates the frequency dependence of today's Class D amplifiers, having an efficiency of about 95% at frequencies below 20 kHz, which falls to about 50% at 2 MHz. Curves D2 and D3 indicates the efficiency for Class D amplifiers that can be foreseen in the future.

Figure 3:
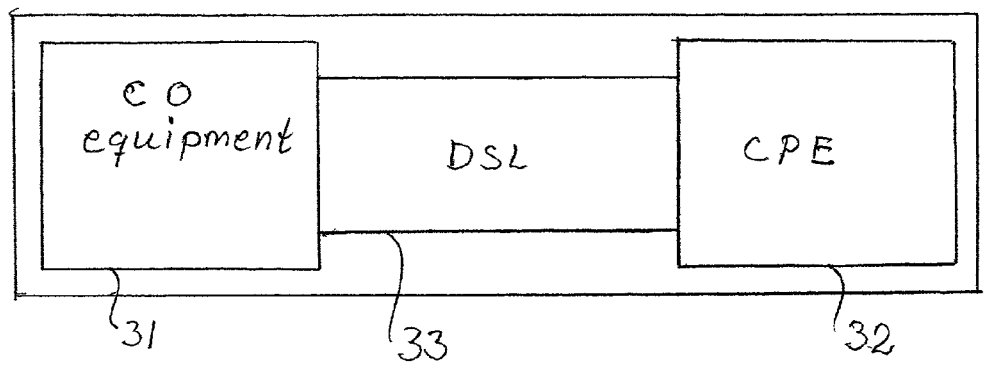
FIG. 3 shows a simple block schematic over a part of a telecommunications system.

FIG. 3 shows a simplified view over some application areas for the present transmitter. A Central Office (CO) in a telesystem has a central office equipment 31 which is connected to a Customer Premises Equipment (CPE), a modem 32, via a Digital Subscriber Line (DSL) 33. The CO equipment 31 and the CPE 32 have each a transmitter as described in the present document. The transmitter can be designed to handle all types of DSL applications, e.g. ADSL, VDSL, SDSL, HDSL and S.HDSL. These applications all use encoded high-speed transmission over copper pairs, such as the copper pairs of the DSL 33. The bandwidth of the digital transmission is in the range of 1 MHz and higher, compared to the normally used analogue transmission bandwidth for a copper pair of about 4 kHz.

The technology of the present transmitter can also be used for high-speed transmission over CATV networks. In this case the transmission media can be a coaxial copper line. It is also possible to use optical fiber as a transmission medial and it is foreseen that even wireless transmission media, in the frequency range of the order of 1 GHz, can be utilized. However, currently it might be problematic to reach the required efficiency in the radio frequency range due to the current state of semiconductor technology.

In the abovementioned pulse width modulation amplifiers, Class D amplifiers, an input signal to be amplified is superimposed onto a carrier signal. The resulting signal is fed through a comparator, where a pulse width modulated signal is generated. The pulse width modulated signal is then amplified in a switching stage, and fed via a low pass filter where the amplified signal is demodulated. In traditional Class D amplification, an external carrier signal with constant frequency is used. Intermodulation products will be produced in the switching stage, located, in the frequency domain, around the frequency of the carrier signal. Hence the frequency of the external carrier signal has to be considerably higher than the highest frequency of the signal to be transmitted, typically by 20–30 times. The use of high frequencies in the switching stage introduces noise to the output signal, the noise level increasing with frequency. Furthermore, the higher the frequency of the carrier signal is, the higher are the power losses in the circuits. The high frequency performance of today's components makes it difficult to provide an output signal of acceptable quality at the frequencies that would be required as external carrier frequencies in telecommunications applications.

Figure 4:
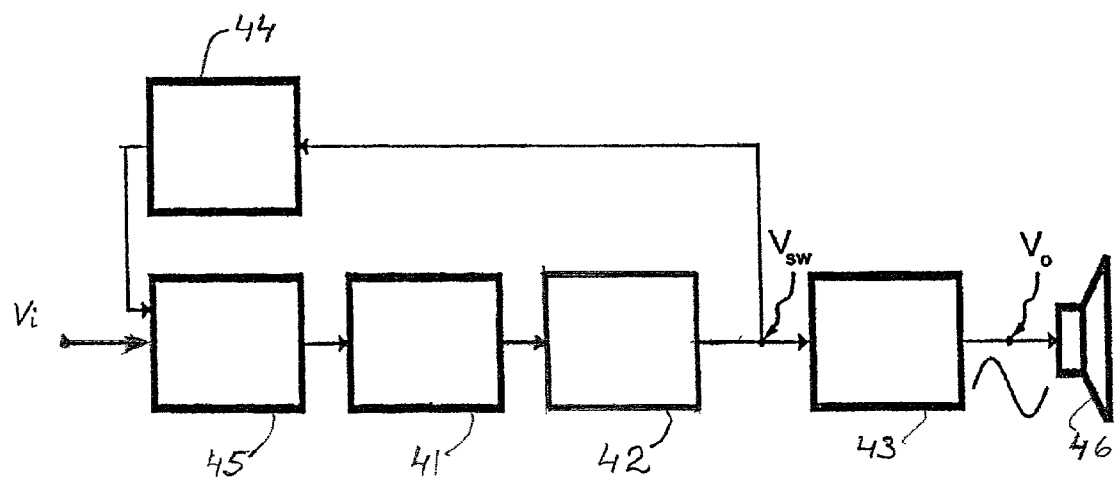
FIG. 4 shows a block schematic over a prior art amplifier.

A prior art Class D amplifier for the audio frequency range with low carrier signal frequency will be shortly commented in connection with FIG. 4. The amplifier is disclosed in detail in the previous mentioned patent application WO 98/19391. The FIG. 4 shows a digital switching amplifier having a controlled self-oscillating pulse modulator 41 followed by a switching amplifier 42. The output from this amplifier is connected to a filter 43 and to a feedback loop having a block 44, the output of which is connected to an input of a forward block 45. The block 45 has a further input for an insignal $V_i$ to be amplified and an output to the modulator 41. An output from the filter 43 is connected to a loudspeaker 46. The blocks 41, 42,34 and 45 are formed to give controlled and stable self-oscillating conditions. An output signal $V_{sw}$ from the amplifier 42 is passed through the block 44 and superimposed on the insignal $V_i$, giving the desired pulse modulation effect. The output signal $V_{sw}$ is filtered into an amplified signal $V_o$ for the loudspeaker 46.

The amplifier in WO 98/19391 has the properties of low power dissipation due to high efficiency, good fidelity in the audio frequency range, low complexity and low output impedance.

A main difference between the amplifier in FIG. 4 and traditional Class D amplifiers is that the traditional amplifiers have an externally generated carrier signal with constant frequency, while the amplifier in FIG. 4 has a carrier signal internally generated in the circuit formed by the blocks 41, 42, 44 and 45. This difference gives rise to frequency properties which will be described in connection with FIGS. 5a and 5b.

Figure 5A:
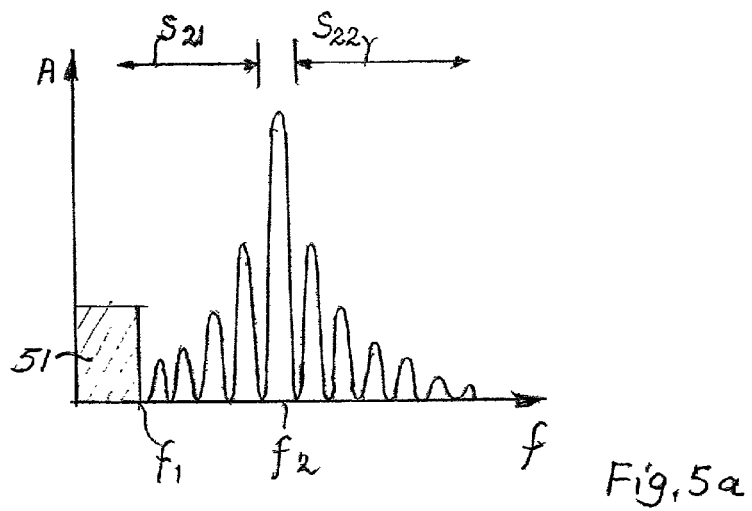
FIGS. 5a and 5b show frequency diagrams for pulse width modulators.

FIG. 5a is a diagram for the amplifier in FIG. 4 with the internally generated carrier. The diagram shows signals of frequencies f having an amplitude A. Signals to be transmitted are within a frequency band 51 having a frequency range $0-f_1$ and the self-oscillating modulator 41 has a switching frequency $f_2$. Intermodulation frequencies are generated in the switching stage 42, giving rise to side bands $S_{21}$ and $S_{22}$. An influence of the sideband on the band 51 is avoided in the amplifier of FIG. 4, if the switching frequency $f_2$ is of the order of five times the frequency $f_1$.

Figure 5B:
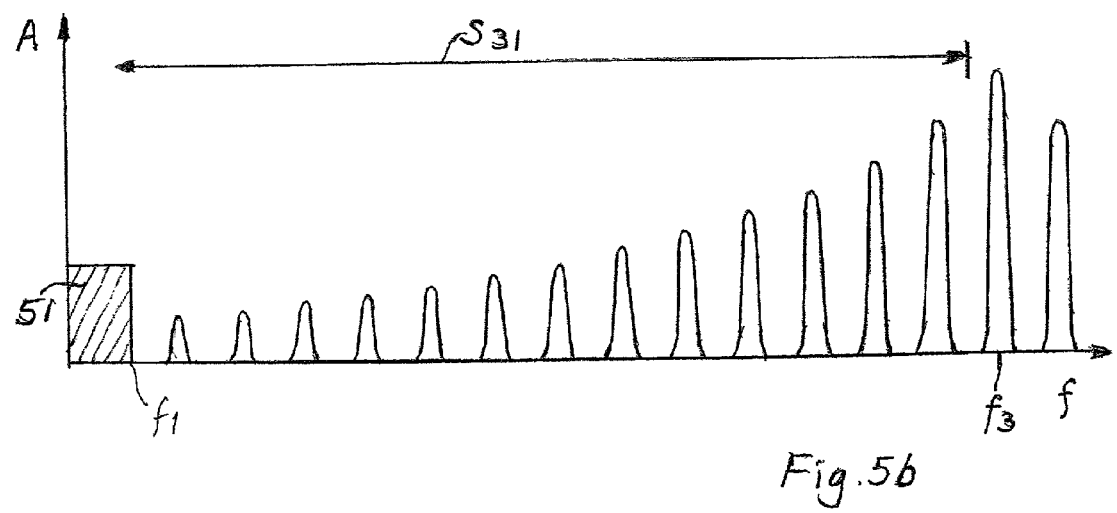

FIG. 5b is a diagram similar to the diagram in FIG. 5a, but for a conventional pulse modulating amplifier with externally generated carrier. This carrier has a switching frequency $f_3$ having a sideband $S_{31}$ of intermodulation frequencies. To avoid influence of the sideband on the band 51 the carrier frequency $f_3$ must, as mentioned above, typically be 20 to 30 times the frequency $f_1$. As also mentioned, this high frequency gives rise to certain problems, among others low efficiency and high power dissipation.

Figure 6:
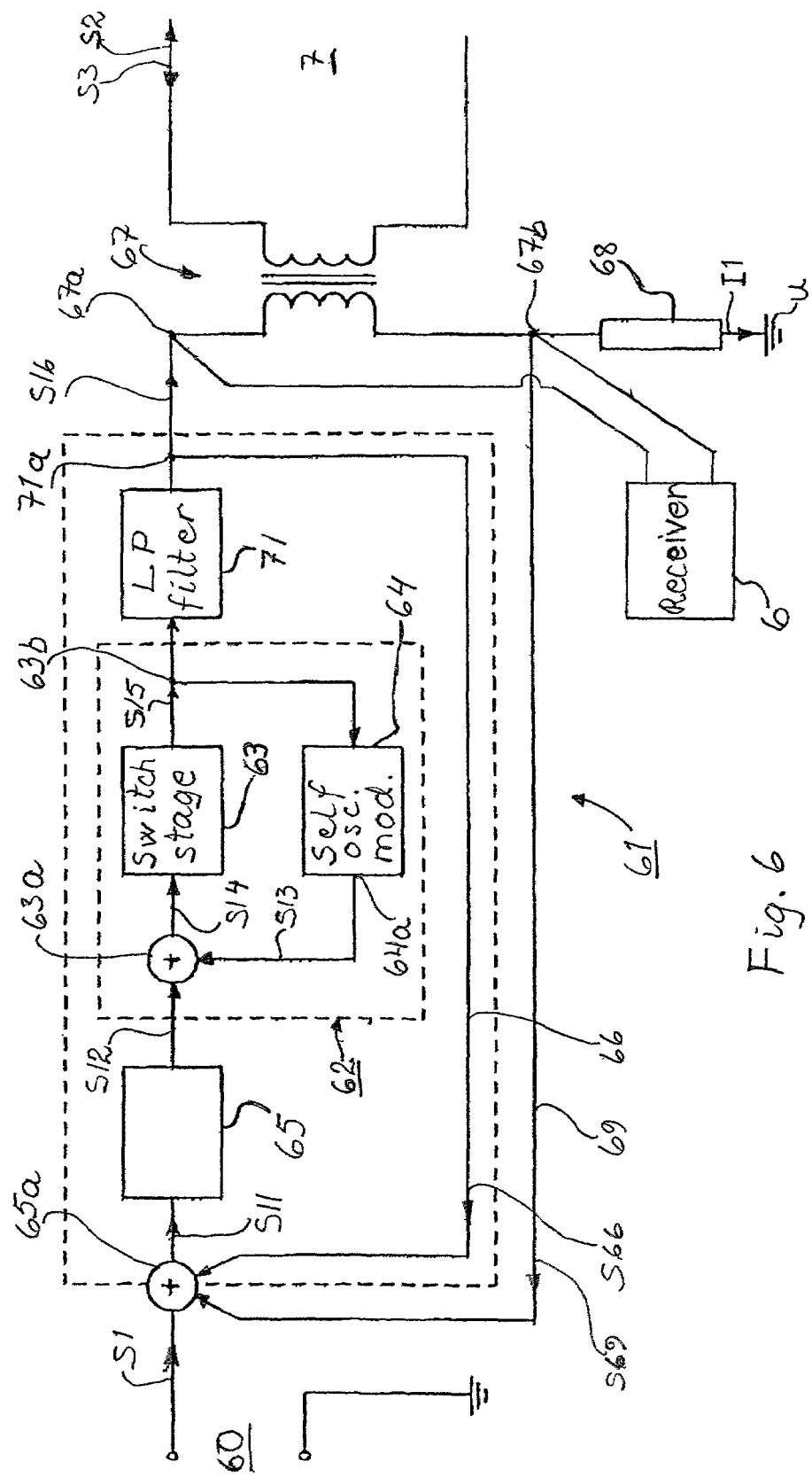
FIG. 6 shows a block schematic over an inventive transmitter.

FIG. 6 shows an exemplifying embodiment 61 of the inventive transmitter. The transmitter comprises an inner feedback loop 62 with positive feedback, having a switching stage 63 and a controlled self oscillating modulator 64. The modulator has a comparator and circuits for generating controlled self oscillations. An output 63b of the switching stage is coupled to the modulator 64, an output 64a of which is coupled to an input 63a of the switching stage. A low pass filter 71 is connected to the output 63b and a compensation block 65 is connected to the input 63a. In a first outer feedback loop 66 an output 71a of the low pass filter 71 has a feedback connection to an input 65a of the compensation block 65. The transmitter 61 has also a transformer 67 coupled to the line 7. The filter output 71a is connected to one end 67a of a first winding of the transformer 67. The same winding has another end 67b which is connected to a sense resistor 68, which is connected to a reference potential U. In a second outer feedback loop 69 the transformer winding end 67b is connected to the compensation block input 65a via a feedback connection. An incoming line 60 for the incoming signals S1 is connected to the compensation block input 65a. The transformer 67 has a second winding which is coupled to the line 7 for the transmitted signals S2 and the received signals S3. The receiver 6 is connected to the respective ends 67a and 67b of the first transformer winding and receives the signal S3.

The transmitter 61 works in the following manner. The incoming telecommunications signal S1, having a frequency $f_0$, is received at the input 65a and a signal S11 is transmitted to the compensation block 65. In this block 65 the signal S11 is compared with feedback signals S66 and S69 on the respective loops 66 and 69 to generate a signal S12. The signal S12 is transmitted to the input 63a where it is superimposed on a carrier signal S13 from the self oscillating modulator 64 into a pulse width modulated signal S14. The signal S14 is amplified in the switching stage 63 into a signal S15 which is fed back to the controlled self oscillating modulator 64. In the modulator the carrier signal S13 is generated with the aid of the comparator. The signal S13 has a frequency $f_4$ in the range of 10 MHz as shown in FIG. 2. The frequency $f_4$ corresponds to the frequency $f_2$ in FIG. 5a. The amplified signal S15 is fed to the low pass filter 71 which filters out the switching frequency $f_4$ and sends a demodulated signal S16 to the transformer 67. The transformer in turn transmits the signal S2 on the line 7. The demodulated signal S16 is fed back to the transmitter input 65a.

The first outer feedback loop 66 is a normal negative feedback to get good performance of the transmitter. The linearity will be improved, distortion is reduced and the frequency stability, i.e. a common amplification in all the frequency band, will also be improved. The second outer feedback loop 69 is utilised to keep the output impedance at a welldefined value of a predetermined magnitude. A current I1 through the sense resistor 68 gives rise to a voltage which is sensed and the sensed value is utilised to keep the output at an impedance of 100 ohm in the embodiment. It is essential that the output impedance keeps its welldefined value since a varying output impedance will influence the incoming signal S3 from a far end transmitter and deteriorate the reception in the receiver 6.

The low pass filter 71 causes a phase shift in the first outer loop 66 having the compensation block 65, the inner feedback loop 62 and the filter itself. This phase shift can cause a self oscillation in the loop if the switching frequency is too low. In the present transmitter the phase shift in the filter 71 is partly compensated by the self oscillating inner loop 62. Therefore the switching frequency $f_4$ in the present transmitter can be comparatively low, as discussed above. If a conventional outer switching frequency had been used this phase compensation would never take place and a much higher switching frequency, corresponding to the frequency $f_3$ of FIG. 5b, had to be used. Furthermore, when using the internally generated self oscillating carrier not only the pulse width is modulated but also to some extent the frequency. This contributes to keep the switching frequency $f_4$ at a low value.

Figure 7:
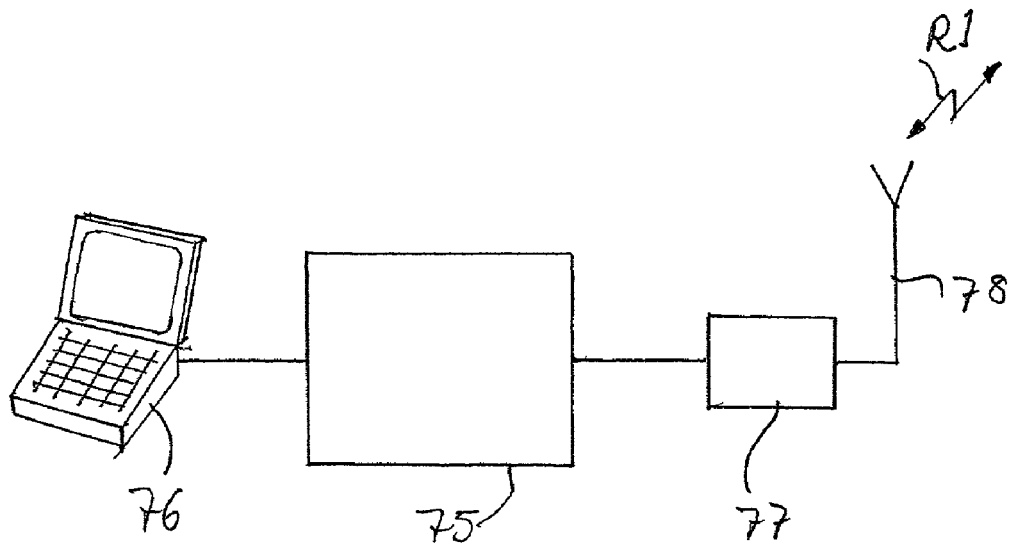
FIG. 7 shows a block schematic over a transmitter connected to a radio.
Figure 8:
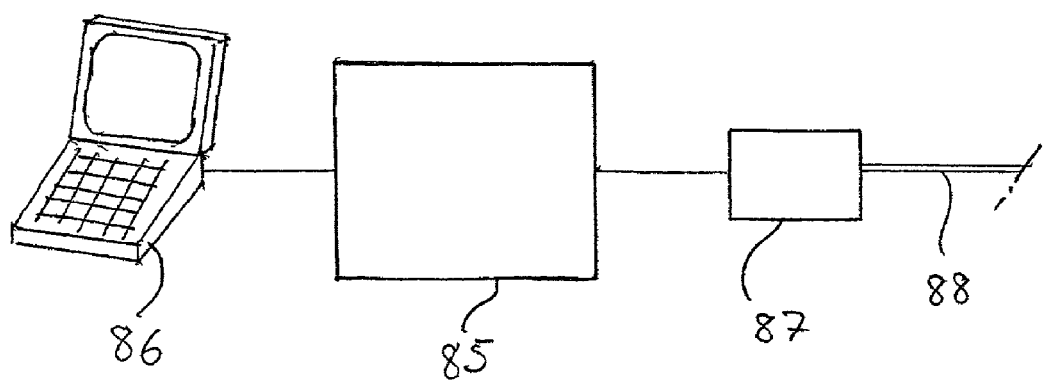
FIG. 8 shows a block schematic over a transmitter connected to an optical line.

In connection with FIGS. 7 and 8 applications of the transmitter with different types of load will be briefly described. FIG. 7 shows a transmitter 75 as described above connected to a digital equipment 76. The output of the transmitter is connected to an antenna circuit 77 for a radio antenna 78, which transmits and receives radio signals R1. Signals from the equipment 76 are amplified in the transmitter 75 before they are transmitted to the antenna circuit. FIG. 8 shows in a corresponding way a transmitter 85 connected to a digital equipment 86. The output of the transmitter is connected to an optical line 88 via a circuit 87, which includes an optical transmitter.

Figure 9:
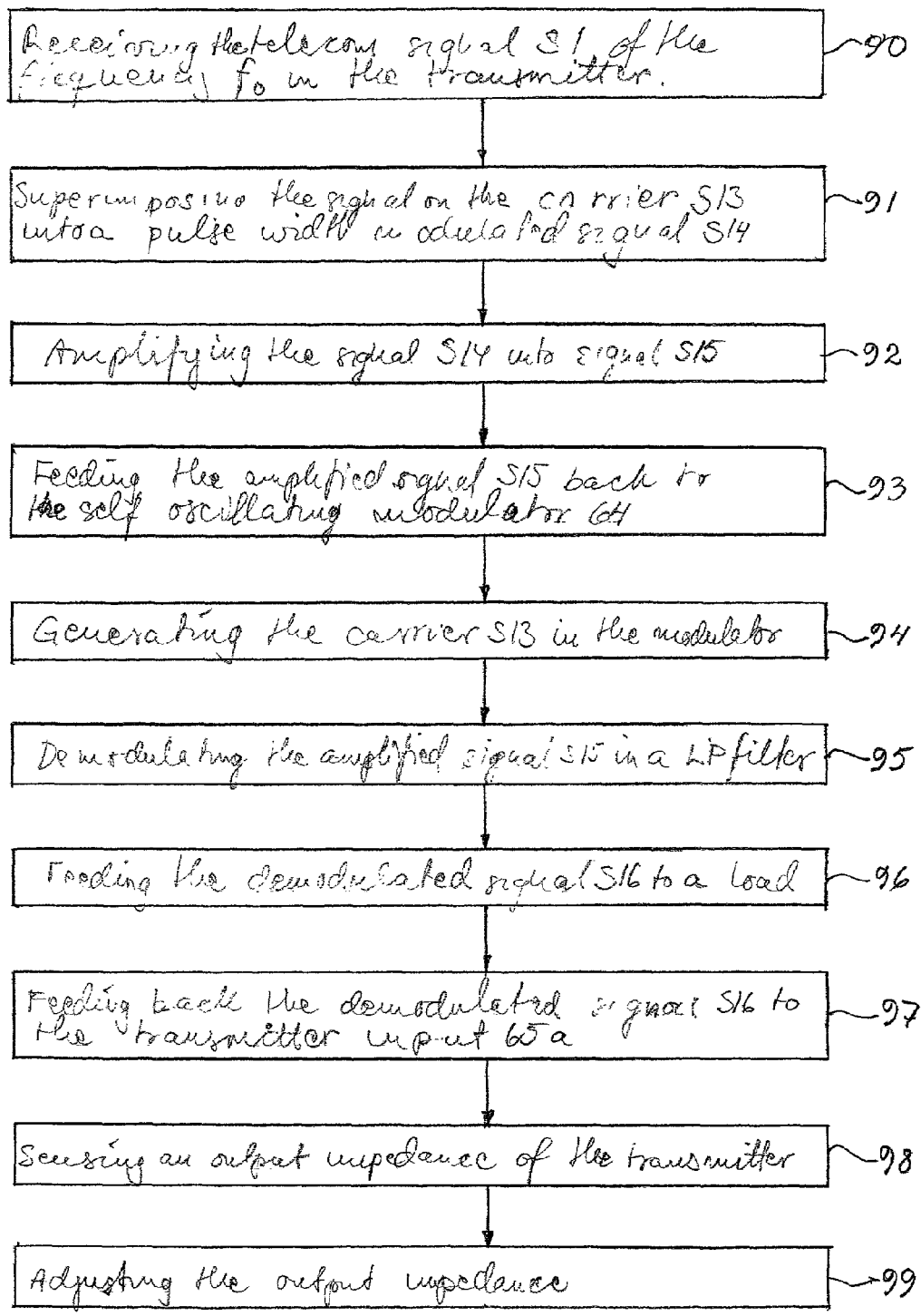
FIG. 9 is a flow chart over an inventive method.

In connection with FIG. 9 a flow chart over the transmission method in the above transmitter will be described. In a first step 90 the telecommunications signal S1 is received in the transmitter 61. The received signal, having the frequency $f_0$, is superimposed on a carrier S13 having the frequency $f_4$ and the pulse width modulated signal S14 is generated, step 91. In a step 92 the pulse width modulated signal S14 is amplified in the switching stage 63 into the signal S15. This signal is fed back to the controlled self oscillating modulator 64, having the oscillation frequency $f_4$, step 93. In a next step 94 the carrier signal S13 is generated in the modulator. The signal S15 is also fed to the low pass filter 71 where it is demodulated into the signal S16, step 95, and in step 96 the demodulated signal S16 is fed to the load. In step 97 the demodulated signal is fed back to the transmitter input to enhance the linearity and frequency stability in normal way. In a step 98 the output impedance of the transmitter is sensed by sensing the voltage over the resistor 68, and in a step 99 the output impedance is adjusted to a predetermined value.

What is claimed is:

1. A transmitter for transmitting a telecommunications signal, the transmitter having an input for an input signal and an output for a load, said transmitter comprising:
    a controlled self-oscillating modulator for pulse width modulating the input signal, said controlled self-oscillating modulator comprising a comparator and means for generating controlled self-oscillations;
    a switching stage for amplification of the pulse width modulated signal, thus generating an amplified pulse width modulated signal;
    a low pass demodulation filter for demodulating the amplified pulse width modulated signal, thus obtaining an output signal to be fed to said transmitter output;
    a feedback loop from the filter to the transmitter input; and
    means for adjusting an output impedance of the transmitter,
    wherein the controlled self-oscillating modulator and the switching stage forms a controlled self-oscillation loop, where the controlled self-oscillating modulator receives the amplified, pulse width modulated signal output by the switching stage and provides the pulse width modulated output signal as a positive feedback to the input of the switching stage, and
    wherein said controlled self-oscillation loop is connected in series to the input of the transmitter and the demodulation filter.

2. The transmitter according to claim 1 further comprising an output transformer having a first winding which is connected with one of its ends to the low pass filter, said means for adjusting the output impedance including a sense resistor connected between a reference potential and a connection point at the other of the ends of the first transformer winding, said connection point being connected to the transmitter input.

3. The transmitter according to claim 1, wherein the controlled self-oscillations have a frequency in the range of 3 to 10 times the frequency of the telecommunications signal.

4. The transmitter according to claim 1, wherein said load is a digital subscriber line.

5. The transmitter according to claim 1, wherein said load is a coaxial line.

6. The transmitter according to claim 1, wherein said load is a radio antenna.

7. A line card for connection of a telecommunications equipment to a transmission line, wherein said line card comprises a transmitter according to claim 1.

8. A modem for connection of a telecommunications equipment to a transmission line, wherein said modem comprises a transmitter according to claim 1.

9. A method of transmitting a telecommunications signal to a load, the method comprising the steps of:
   superimposing the telecommunications signal on a carrier signal into a pulse width modulated signal;
   amplifying the pulse width modulated signal;
   inputting the amplified pulse width modulated signal to a controlled self-oscillating modulator;
   generating said carrier signal in said controlled self-oscillating modulator;
   inputting the amplified pulse width modulated signal to a low pass filter to generate a demodulated signal;
   feeding back said demodulated signal and superimposing it on the telecommunications signal;
   adjusting an output impedance of the transmitter; and
   feeding said demodulated signal to the load.

10. The method according to claim 9, wherein the carrier signal has a frequency in the range of 3 to 10 times the frequency of the telecommunications signal.

11. The method according to claim 9, wherein the transmitter comprises an output transformer having a first winding which is connected with one of its ends to the low pass filter and with the other of its ends to a sense resistor which is connected to a reference potential, the method including:
   sensing a current through the sense resistor;
   performing said adjusting of the output impedance with the aid of said current.

* * * * *